United States Patent
Kobayashi et al.

[11] Patent Number: 6,040,524
[45] Date of Patent: *Mar. 21, 2000

[54] PRINTED CIRCUIT BOARD HAVING TWO HOLES CONNECTING FIRST AND SECOND GROUND AREAS

[75] Inventors: Yuji Kobayashi; Shinichiro Yamashita, both of Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/568,317

[22] Filed: Dec. 6, 1995

[30] Foreign Application Priority Data

Dec. 7, 1994 [JP] Japan .................................. 6-303886

[51] Int. Cl.[7] ...................................................... H01B 7/34
[52] U.S. Cl. .......................... 174/36; 174/262; 174/263; 333/1
[58] Field of Search ..................................... 174/262, 266, 174/261, 260, 250, 117 FF; 333/238, 246; 361/750, 751, 749, 748, 794

[56] References Cited

U.S. PATENT DOCUMENTS

| | | | |
|---|---|---|---|
| 3,613,230 | 10/1971 | Griff ............................................ | 29/828 |
| 4,130,723 | 12/1978 | Wakeling ................................... | 174/36 |
| 4,362,899 | 12/1982 | Borrill ....................................... | 174/36 |
| 4,798,918 | 1/1989 | Kabadi et al. .............................. | 174/36 |
| 5,003,273 | 3/1991 | Oppenberg ................................. | 333/1 |
| 5,272,600 | 12/1993 | Carey ......................................... | 361/792 |
| 5,275,330 | 1/1994 | Isaacs et al. ........................... | 228/180.2 |
| 5,446,243 | 8/1995 | Crowder et al. .......................... | 174/250 |
| 5,455,393 | 10/1995 | Ohshima et al. ......................... | 174/250 |
| 5,538,433 | 7/1996 | Arisaka ...................................... | 439/70 |

*Primary Examiner*—Kristine Kincaid
*Assistant Examiner*—Kamand Cuneo
*Attorney, Agent, or Firm*—Frommer Lawrence & Haug, LLP; William S. Frommer

[57] ABSTRACT

A printed circuit board and video switcher board containing the circuit board including a first dielectric lamina having opposed surfaces and a first layer deposited on one of the surfaces which has of a plurality of first layer signal lines on one of the surfaces. A plurality of first ground areas of defined width are arranged between the first layer signal lines such that each of the first layer signal lines has one of the first ground areas on a side thereof so that none of the first layer signal lines is immediately adjacent to another first layer signal line. A second substantially uninterrupted layer on the other surface of the first lamina forming a second ground area which is substantially coextensive with the other surface. At least two holes extend through the first lamina between the first and second ground areas and each of the holes has openings at the first ground areas and at the second ground area. A conductive member in the holes electrically connects the first and second ground areas for shielding the first layer signal lines from each other, and the separation between the holes is less than the width of the first ground areas.

25 Claims, 6 Drawing Sheets

PRINTED CIRCUIT BOARD HAVING TWO HOLES CONNECTING FIRST AND SECOND GROUND AREAS

BACKGROUND OF THE INVENTION

1. Field of the Invention

This invention relates generally to printed circuit boards in which micro-strips are provided to constitute respective signal lines of constant impedance for use in transmitting digital signals at high speed, for example, in a video switcher.

2. Description of the Prior Art

Known devices, such as, video switchers that may be employed in video special effects generators, generally use a coaxial cable to transmit a high frequency signal at high speed because a coaxial cable is characterized by a constant impedance required for transmitting a high frequency signal with high efficiency and high fidelity. Further, the coaxial cable is desirable in that is protects the high frequency signal being transmitted from being affected by extraneous disturbances or signals. However, when a number of signal lines are to be interconnected within a device, for example, a video switcher or the like, if coaxial cables are employed as constant impedance signal lines therefor, desirable miniaturization of the device cannot be effected and the cost of interconnecting the signal lines is relatively high.

On the other hand, if micro-strips of constant impedance on a printed circuit board are used as signal lines for transmitting respective high frequency signals at high speed, for example, as in a video switcher, such signal lines can be provided inexpensively and the device can be readily miniaturized as compared with the case where the signal lines are constituted by coaxial cables.

Therefore, as shown in FIG. 1, it has been proposed to provide a so-called double-sided printed circuit board 10 comprised of a dielectric lamina or sheet 11, for example, of a glass epoxy of the type known as FR-4, having opposed surfaces $S_1$ and $S_2$ at the front and back, respectively, of the dielectric lamina 11. The printed circuit board 10 is further shown to include a pattern 12 of signal lines of constant impedance constituted by respective spaced apart micro-strips suitably deposited on the front surface $S_1$ and a ground plane or area 13 disposed on the surface $S_2$ at the back of the dielectric lamina 11.

The characteristic impedance Z (in ohms) of the printed circuit board 10 may be expressed by the following equation:

$$Z = \frac{87}{\sqrt{\epsilon + 1.41}} \log e \frac{5.98h}{0.8W + t} \quad (1)$$

where W is the width of each micro-strip included in the pattern 12 of signal lines formed on the surface $S_1$, t is the thickness of each micro-strip, h is the thickness or height of the dielectric lamina 11, that is, the distance from each micro-strip or signal line 12 on the surface $S_1$ to the ground plane or area 13 on the surface $S_2$ of the lamina 11, and $\epsilon$ is the dielectric constant of the material making up the dielectric lamina 11 and serving as the isolating material of the printed circuit board 10.

In the case of a double-sided board, as shown in FIG. 1, the pattern 12 of one or more signal lines is formed only on the front surface $S_1$ so that the double-sided board 10 is substantially equivalent to a single layer board or relatively low density or signal handling efficiency. If other printed circuits are provided on the board 10 along with the signal line pattern 12, the density of such single pattern of signal lines on the board will not be sufficient to accommodate the transmission of signals to and from the other circuits which are provided on the same board. Therefore, as shown in FIG. 2, it has been proposed to provide a so-called four-layer board 20 comprised of a first dielectric lamina 21 having opposed surfaces $S_1$ and $S_2$, a first layer $L_1$ deposited on the surface $L_1$ and comprised of a pattern 24 of micro-strips constituting one or more signal lines, and a second layer $L_2$ deposited on the surface $S_2$ of the dielectric lamina 21 and constituting a ground plane or area. The printed circuit board 20 is further shown to include a second dielectric lamina 22 having opposed surfaces $S_3$ and $S_4$ on which there are respectively deposited a third layer $L_3$ comprised of a pattern 25 of micro-strips constituting one or more signal lines, and a fourth layer $L_4$ which constitutes a ground plane or area. Finally, the printed circuit board 20 is shown to include a third dielectric lamina 23 having opposed surfaces $S_5$ and $S_6$ and being interposed between the first and second dielectric laminae 21 and 22 with the second layer $L_2$ on the lamina 21, that is, the ground area or plane on the surface $S_2$, and the fourth layer $L_4$ on the lamina 22, that is, the ground area or plane on the surface $S_4$, facing toward the opposed surfaces $S_5$ and $S_6$, respectively, of the third dielectric lamina 23. It will be appreciated that, in the printed circuit board 20, the layers $L_1$ and $L_3$ provide signal lines at the opposite outer surfaces $S_1$ and $S_3$ of the circuit board. Since the four-layer board 20 shown in FIG. 2 includes ground planes or areas constituted by the layers $L_2$ and $L_4$ interposed between the layers $L_1$ and $L_3$ which constitute the patterns 24 and 25 of signal lines on the front and back surfaces $S_1$ and $S_3$, respectively, of the circuit board, signals transmitted through the signal lines constituted by the layer $L_1$ will not be affected or disturbed by signals transmitted through signal lines constituted by the layer $L_3$.

However, if the micro-strips 12 deposited only on the surface $S_1$ in the case of the printed circuit board 10 are arranged so as to form two or more independent signal lines, as indicated at 12a, 12b and 12c on FIG. 1, and different signals are transmitted through such lines 12a, 12b and 12c, then cross-talk will occur between the adjacent lines on the surface $S_1$. Similarly, in the case of the four-layer printed circuit board 20 shown in FIG. 2, if the micro-strips forming the layer $L_1$ are arranged to constitute independent signal lines indicated at 24a, 24b and 24c, then cross-talk will occur between the adjacent signal lines represented at 24a, 24b and 24c on surface $S_1$. In the same manner, if the micro-strips constituted by the layer $L_3$ are arranged to form independent signal lines indicated at 25a, 25b and 25c, then cross-talk will occur between the signals respectively transmitted through the adjacent signal lines 25a, 25b and 25c. Such cross-talk between signals transmitted through independent signal lines constituted by adjacent micro-strips on the surface $S_1$ or $S_3$ will cause deterioration of the signal transmission efficiency as compared with the case in which signals are transmitted through respective coaxial cables.

In the case of standard printed circuit boards of either the double-sided type (FIG. 1) or the multi-layer type (FIG. 2), but which are not fabricated with the signal lines on one or more of the surfaces thereof, as at 12a–12c on FIG. 1 or at 24a–24c and 25a–25c on FIG. 2, it has been known to provide the printed circuit board with a hole extending therethrough for receiving a screw or other fastening element by which the printed circuit board is attached to the device employing the same. For example, FIG. 3 shows a standard double-sided printed circuit board 10' comprised of a dielectric lamina 11' having a hole 26 board therethrough for receiving an attachment screw (not shown) which also serves to electrically connect ground planes 12' and 13' deposited on the front and back surface $S'_1$ and $S'_2$ of the lamina L'. However, it is to be understood that the standard printed circuit board 10' typified by FIG. 3 does not include signal lines constituted by micro-strips on a surface of the dielectric lamina 11'.

OBJECTS AND SUMMARY OF THE INVENTION

Accordingly, it is an object of this invention to provide a printed circuit board having a pattern of micro-strips on at least one surface thereof constituting a plurality of signal lines through which respective signals can be efficiently transmitted without deterioration due to cross-talk between signals transmitted through adjacent signal lines that substantially exceeds the level of such deterioration occurring when the signals are transmitted through coaxial cables.

It is another object of this invention to provide a printed circuit board with a plurality of signal lines constituted by respective micro-strip patterns on each of two or more surfaces of the board, and in which cross-talk occurring between signal lines on the same surface of the board, as well as cross-talk occurring between signal lines on different surfaces of the board are substantially alleviated.

In accordance with an aspect of this invention, a printed circuit board with a plurality of signal lines of constant impedance constituted by respective micro-strips deposited on a surface of a dielectric lamina is further provided with a pattern of ground areas formed on that surface between the adjacent micro-strips constituting respective signal lines, and with holes extending through the lamina from the pattern of ground areas and through which the latter are connected electrically with another ground area or plane on a surface of the printed circuit board spaced from that on which the signal lines are provided for providing three-dimensional shielding of the signal lines from each other. More specifically, in a double-sided printed circuit board according to this invention, a dielectric lamina having opposed surfaces is provided with a first layer deposited on one of such surfaces and comprised of a plurality of spaced apart micro-strips constituting at least respective first and second signal lines and a pattern of first ground areas arranged between the first and second signals lines on that one surface of the dielectric lamina, a second layer deposited on the other surface of the dielectric lamina and constituting a second ground area, holes extending through the dielectric lamina and each having openings at a respective one of the first ground areas and at the second ground area, and conductive means, such as, a conductive plating on an interior surface of each of the holes or solder filling each of the holes in the dielectric lamina and contacting the respective first ground area and second ground area through the openings of the respective holes at the first and second ground areas for electrically connecting the first and second ground areas and thereby three-dimensionally shielding the first and second signal lines on that one surface of the dielectric lamina from each other.

In the case where the printed circuit board according to this invention has a plurality of constant impedance signal lines formed on each of at least two surfaces of the board, there are provided, in addition to the first mentioned dielectric lamina and the first and second layers thereof, at least second and third dielectric laminae each having respective opposed surfaces, a third layer deposited on one of the surfaces of the second lamina and comprised of a plurality of spaced apart micro-strips constituting respective third and fourth signal lines and a pattern of third ground areas arranged between the third and fourth signal lines on the one surface of the second dielectric lamina, a fourth layer on the other surface of the second dielectric lamina constituting a fourth ground area, holes extending through the second dielectric lamina and each having openings at a respective one of the third ground areas and at the fourth ground area, and conductive means in the holes extending through the second dielectric lamina and electrically connecting the third and fourth ground areas for shielding the third and fourth signal lines on the one surface of the second dielectric lamina from each other, with the third dielectric lamina being interposed between the first and second dielectric laminae with one of the first and second layers on the first dielectric lamina and one of the third and fourth layers on the second dielectric lamina facing toward respective opposed surfaces of the third dielectric lamina.

In the case where the second and fourth layers on the first and second dielectric laminae, respectively, face toward the respective opposed surfaces of the third dielectric lamina, the ground areas constituted by the second and fourth layers are interposed between the first and second signal lines included in the first layer and the third and fourth signal lines included in the third layer, respectively, and thereby shield the signal lines included in the first layer from the signal lines included in the third layer. On the other hand, if the first and third layers on the first and second laminae, respectively, face toward the respective opposed surfaces of the third dielectric lamina, then the micro-strips of the first layer are desirably offset, for example, in a transverse direction, in respect to the micro-strips of the third layer for alleviating cross-talk that would otherwise occur between signals transmitted through the first and second signal lines and signals transmitted through the third and fourth signal lines, respectively.

In accordance with a further aspect of this invention, a printed circuit board is provided with a plurality of signal lines of constant impedance at more than two layers of the board, for example, at each of four layers. In such case, first and third layers which include first and second signal lines and third and fourth signal lines, respectively, on first and second laminae, face away from a third lamina to form respective outer surfaces of the board, and the board further comprises fourth and fifth dielectric laminae each having respective opposed surfaces and being interposed between the first and third dielectric laminae and between the second and third dielectric laminae, respectively. One of the opposed surfaces of the fourth dielectric lamina is in confronting relation to the second layer on the first dielectric lamina, while a fifth layer is deposited on the other surface of the fourth dielectric lamina which confronts one of the surfaces of the third dielectric lamina, such fifth layer including a plurality of spaced apart micro-strips constituting respective fifth and sixth signal lines and a pattern of fifth ground areas arranged between the fifth and sixth signal lines on the other surface of the fourth dielectric lamina. One of the opposed surfaces of the fifth dielectric lamina confronts the fourth layer on the second dielectric lamina, while a sixth layer is deposited on the other surface of the fifth dielectric lamina which confronts the other of the surfaces of the third dielectric lamina, such sixth layer including a plurality of spaced apart micro-strips constituting respective seventh and eighth signal lines and a pattern of sixth ground areas arranged between the seventh and eighth signal lines. Holes extend through the fourth dielectric lamina and each have openings at a respective one of the fifth ground areas and at the second ground area on the first dielectric lamina, and holes extend through the fifth dielectric lamina and each have openings at a respective one of the sixth ground areas and at the fourth ground area on the second dielectric lamina. Conductive means in the foregoing holes extend through the fourth and fifth dielectric laminae and electrically connect the second and fifth ground areas and the fourth and sixth ground areas for shielding the fifth and sixth signal lines and the seventh and eighth signal lines from each other.

In an embodiment of the immediately above described aspect of the invention, the holes extending through the fourth dielectric lamina and the holes extending through the fifth dielectric lamina are desirably aligned extensions of the holes extending through the first dielectric lamina and the holes extending through the second dielectric lamina, respectively.

Moreover, the micro-strips constituting the fifth and sixth signal lines and the micro-strips constituting the seventh and eighth signal lines are desirably offset relative to each other and also offset relative to the micro-strips constituting the first and second signal lines and the micro-strips constituting the third and fourth signals, respectively, so as to alleviate cross-talk between signals transmitted through signal lines included in any one of the first, third, fifth and sixth layers of the described printed circuit board and signals transmitted through any of the signal lines included in any others of the first, third, fifth and sixth layers. More specifically, the micro-strips constituting the fifth and sixth signal lines are desirably offset transversely relative to the micro-strips constituting the seventh and eighth signal lines, while the micro-strips constituting the fifth, sixth, seventh and eighth signal lines, respectively, are offset angularly relative to the micro-strips constituting the first, second, third and fourth signal lines, respectively.

It is still another object of this invention to provide a video switcher comprised of a plurality of electrically connected printed circuit boards, and in which signal lines of constant impedance are constituted by spaced apart micro-strips on one or more dielectric laminae of respective printed circuit boards in accordance with previously described aspects of the invention so that cross-talk between adjacent signal lines is alleviated while inexpensive miniaturization of the video switcher can be realized.

The above, and other objects, features and advantages of the invention will be apparent in the following detailed description of the invention which is to be read in connection with the accompanying drawings.

DETAILED DESCRIPTION OF THE PREFERRED EMBODIMENTS

Figure 1:
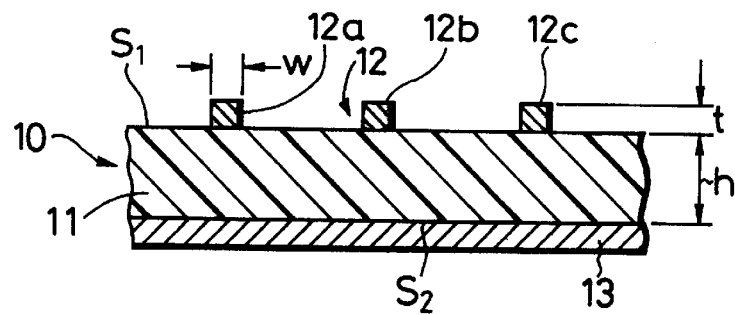
FIG. 1 is a sectional view showing a double-sided printed circuit board according to the prior art having micro-strips on one outer surface of the board for providing signal lines of constant impedance.
Figure 4:
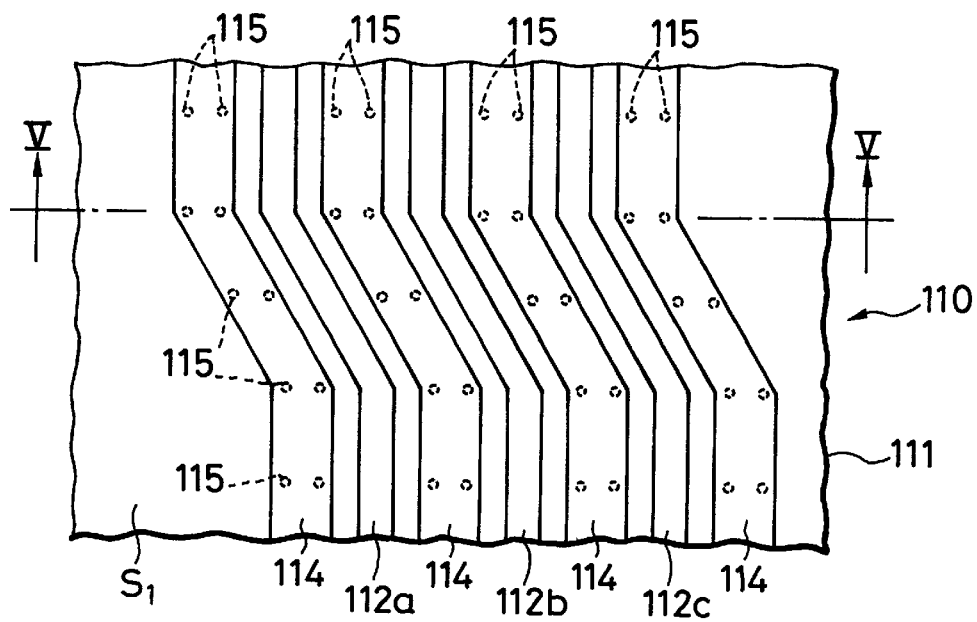
FIG. 4 is a fragmentary plan view of a double-sided printed circuit board which, in accordance with an embodiment of this invention, has a plurality of signal lines of constant impedance included in a layer of the board at an outer surface of the latter.
Figure 5:
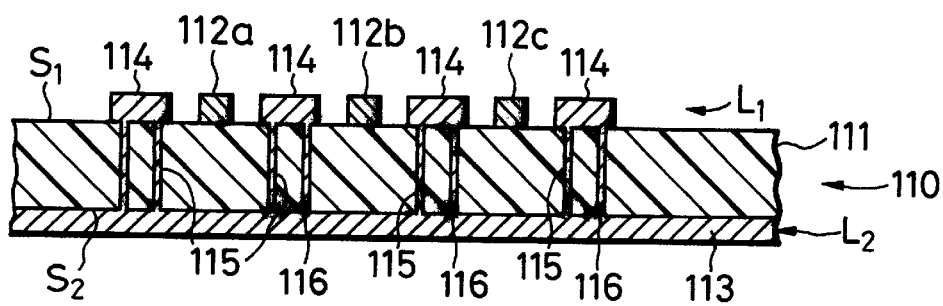
FIG. 5 is a sectional view taking along the line V—V on FIG. 4.

Referring initially to FIGS. 4 and 5, it will be seen that a printed circuit board 110 in accordance with an embodiment of this invention may be of the double-sided type, that is, generally similar to the printed circuit board of the prior art shown in FIG. 1, and similarly comprises a dielectric lamina 111, for example, of the glass epoxy known as FR-4, and having opposed surfaces $S_1$ and $S_2$ on which first and second layers $L_1$ and $L_2$ are respectively deposited. The first layer $L_1$ is comprised of a plurality of spaced apart micro-strips constituting two or more signal lines of constant impedance indicated at 112a, 112b and 112c, for the transmission therethrough of respective high frequency signals, and the second layer $L_2$ deposited on the surface $S_2$ constitutes a ground area or plane 113. Holes 115 are located as side-by-side pairs with a separation less than the width of the ground areas 114, as can be seen from FIG. 4.

The printed circuit board 110 in accordance with this invention is distinguished from the board 10 of the prior art in that the layer $L_1$ of the board 110 comprises, in addition to the signal lines 112a, 112b and 112c, a pattern of ground areas 114 which are arranged between the signal lines 112a, 112b and 112c on the surface $S_1$. Further, holes 115 are bored or otherwise made to extend through the dielectric lamina 111 at numerous spaced apart locations spaced apart along the ground areas 114, with each of the holes 115 having openings at a respective one of the ground areas 114 of the first layer $L_1$ and at the ground area or plane 113 constituted by the second layer $L_2$. Finally, the holes 115 contain conductive means indicated at 116 on FIG. 5 and which electrically connect the ground areas 114 in the layer $L_1$ on surface $S_1$ with the ground area or plane 113 constituted by the layer $L_2$ on the opposite surface $S_2$. Such conductive means 116 in each of the holes 115 may be constituted by a conductive plating on the interior surface of the hole which extends into contact with the respective ground area 114 on the surface $S_1$ and the ground area 113 on the surface $S_2$ through the openings of the respective hole 115 at the ground areas 114 and 113. Alternatively, the conductive means 116 may be formed by solder filling each of the holes 115 and contacting the respective ground areas 114 and 113 through the openings of the respective hole at such areas. In either case, the ground areas 114 extending between the signal lines 112a, 112b and 112c on the surface $S_1$ of the board are electrically connected through the conductive means 116 in the holes 115 with the ground area or plane 113 on the surface $S_2$ for providing a three-dimensional shielding arrangement for the signal lines 112a, 112b and 112c, by which different high frequency signals can be transmitted through the lines 112a, 112b and 112c, respectively, while cross-talk between such signal lines is substantially alleviated.

Figure 2:
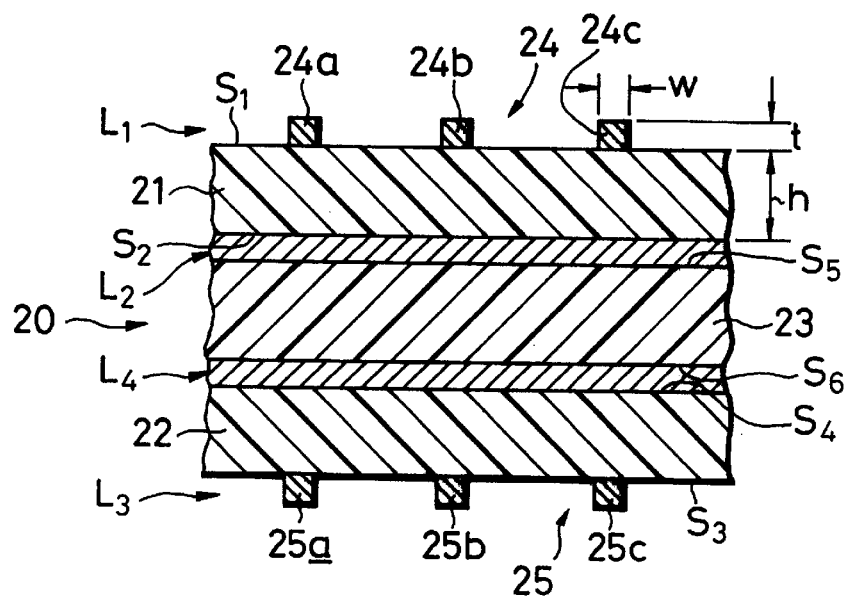
FIG. 2 is a sectional view similar to that of FIG. 1, but showing a multi-layered printed circuit board according to the prior art in which signal lines are provided on the opposed outer surfaces of the board.
Figure 3:
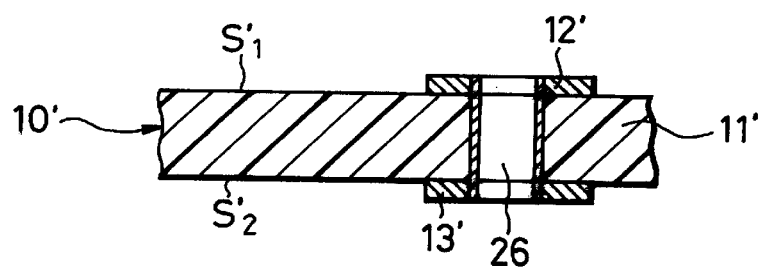
FIG. 3 is a detailed sectional view showing an arrangement for securing a printed circuit board in an electronic device when the printed circuit board is of the type having signals transmitted to and from circuits on the board by means of coaxial cables, rather than by means of microstrips deposited on a surface or surfaces of the board for defining respective signal lines.
Figure 6:
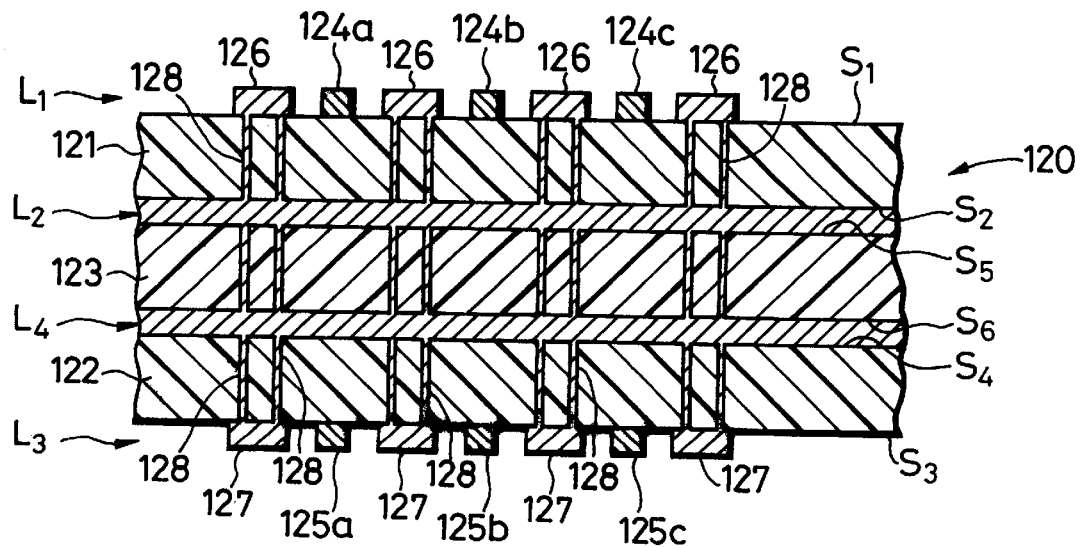
FIG. 6 is a sectional view similar to that of FIG. 5, but in which the printed circuit board, in accordance with another embodiment of this invention, has a plurality of signal lines provided in each of two layers of the board at opposed outer surfaces thereof.

Although the invention has been described above with reference to FIG. 4 and 5 as applied to a double-sided printed circuit board in which signal lines are provided on only one surface of the board, it is to be understood that the invention is also applicable to a four-layer printed circuit board of the type previously described with reference to FIG. 2, that is, in which signal lines are provided on opposed outwardly facing surfaces of the board. Thus, as shown in FIG. 6, a printed circuit board 120 in accordance with another embodiment of the invention may comprise a first dielectric lamina 121 having opposed surfaces $S_1$ and $S_2$, a first layer $L_1$ deposited on the surface $S_1$ and comprised of a plurality of spaced apart micro-strips constituting respective signal lines 124a, 124b and 124c, and a pattern of first ground areas 126 arranged between the signal lines 124a, 124b and 124c on the surface $S_1$, and a second layer $L_2$ on the surface $S_2$ of the lamina 121 and which constitutes a second ground area. The printed circuit board 120 is further shown to comprise a second dielectric lamina 122 having opposed surfaces $S_3$ and $S_4$, and a third dielectric laminae 123 having opposed surfaces $S_5$ and $S_6$. A third layer $L_3$ is deposited on the surface $S_3$ of the second lamina 122 and is comprised of a plurality of spaced apart micro-strips constituting respective signal lines 125a, 125b and 125c which, in the embodiment shown on FIG. 6, are aligned with the signal lines 124a, 124b and 124c, respectively, on the opposite outer surface $S_1$ of the board 120. The third layer $L_3$ of the board 120 is further shown to include a pattern of third ground areas 127 arranged between the signal lines 125a, 125b and 125c on the surface $S_3$ of the second dielectric lamina 122. A fourth layer $L_4$ is provided on the surface $S_4$ of the second dielectric lamina 122 and constitutes a fourth ground area. In the printed circuit board 120, the third dielectric lamina 123 is interposed between the first and second dielectric laminae 121 and 122, with the second and fourth layers $L_2$ and $L_4$ on the first dielectric lamina 121 and on the second dielectric lamina 122, respectively, facing toward surfaces $S_5$ and $S_6$, respectively, of the third dielectric lamina 123. Finally, in the printed circuit board 120, the first ground areas 126 of the first layer $L_1$ and the third ground areas 127 of the third layer $L_3$ have respective registering or aligned portions, and holes 128 extend through the dielectric laminae 121, 122 and 123 and through the intermediate layers $L_2$ and $L_4$ constituting ground areas or plane at numerous locations along the first and third ground areas 126 and 127, with the holes 128 all containing conductive plating or solder by which the ground areas 126 interposed between the signal lines on the surface $S_1$, the ground areas 127 interposed between the signal lines on the surface $S_3$, and the ground areas constituted by the layers $L_2$ and $L_4$ are all electrically connected to each other.

It will be appreciated that, in the printed circuit board 120 according to this invention, the signal lines 124a, 124b and 124c on the surface $S_1$ may all transmit respective high frequency signals while the signal lines 125a, 125b and 125c on the surface $S_3$ simultaneously transmit other respective high frequency signals. Since the ground areas constituted by the layers $L_2$ and $L_4$ are interposed between the signal lines on the surface $S_1$ and the signal lines on the surface $S_3$, the signal lines 124a–124c are effectively shielded from the signal lines 125a–125c, and such signal lines on the surfaces $S_1$ and $S_3$, respectively, can transmit respective signals without significant cross-talk therebetween. Furthermore, by reason of the ground areas 126 interposed between the signal lines 124a, 124b and 124c and electrically connected at least with the ground area constituted by the layer $L_2$, individual signals can be transmitted through the signal lines 124a, 124b and 124c, respectively, without significant cross-talk therebetween. Similarly, by reason of the shielding effect of the ground areas 127 interposed between the signal lines 125a, 125b and 125c on the surface $S_3$ and connected with the ground area constituted by the layer $L_4$, respective signals can be transmitted through the signal lines 125a, 125b and 125c without significant cross-talk between such signal lines. Therefore, it is apparent that the present invention makes it possible to provide a density of the signal lines on the printed circuit board 120 that is compatible with the density of other printed circuits that may be provided on or for use with such board, while avoiding cross-talk between the various signals being transmitted through the signal lines of constant impedance.

Figure 11:
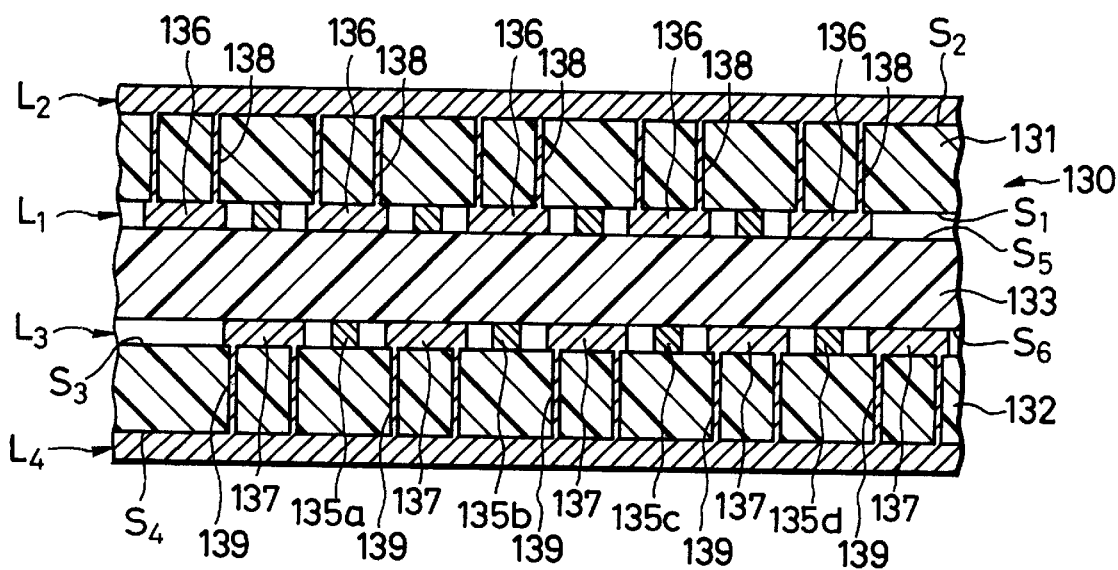
FIG. 11 is a sectional view similar to that of FIG. 6, but showing yet another embodiment of a printed circuit board according to this invention having a plurality of signal lines provided in two layers within the board.

Although the first and third layers $L_1$ and $L_3$ on the first and second dielectric laminae 121 and 122, respectively, face away from the third dielectric laminae 123 in the printed circuit board 120 of FIG. 6 so that the signal lines 124a–124c and the signal lines 125a–125c in such layers appear at the outer or front and back surfaces of the board 120, the described components of such four-layer board may be rearranged in accordance with the invention to provide the signal lines in layers that are within the board. Thus, for example, as shown in FIG. 11, a four-layer printed circuit board 130 according to another embodiment of the invention may have its first and second dielectric laminae 131 and 132 arranged with the layers $L_1$ and $L_3$ deposited on the surfaces $S_1$ and $S_3$, respectively, thereof facing toward the respective opposed surfaces $S_5$ and $S_6$ of the third dielectric lamina 133. Thus, in the board 130, the micro-strips which constitute signal lines 134a, 134b, 134c and 134d and the pattern of first ground areas 136 arranged between such signal lines on the surface $S_1$ are included in the layer $L_1$ interposed between the first and third dielectric laminae 131 and 133, while the layer $L_2$ on the surface $S_2$ of the first lamina 131 and which constitutes a second ground area forms an outer or front surface of the board 130. Similarly, spaced apart micro-strips which form respective signal lines 135a, 135b, 135c and 135d, and a pattern of ground areas 137 arranged between the signal lines 135a–135d on the surface $S_3$ are included in the layer $L_3$ interposed between the second and third dielectric laminae 132 and 133, while the layer $L_4$ deposited on the surface $S_4$ of the second lamina 132 and constituting a fourth ground area forms the other outer or back surface of the board 130. Further, in accordance with the invention, holes 138 extend through the first dielectric lamina 131 and each have openings at a respective one of the ground area 136 in the layer $L_1$ and at the ground area constituted by the layer $L_2$. Similarly, holes 139 extend through the second dielectric lamina 132 and each have openings at a respective one of the ground areas 137 in the layer $L_3$ and at the ground area constituted by the layer $L_4$. Conductive means, such as, conductive plating or solder, within the holes 138 and 139 electrically connect the ground areas 136 and the ground areas 137 with the ground areas constituted by the layers $L_2$ and $L_4$, respectively. By reason of such interconnections, the ground areas 136 together with the ground area constituted by the layer $L_2$ effectively shield the signal lines 134a, 134b, 134c and 134d from each other so that respective high frequency signals can be transmitted through such signal lines without significant cross-talk therebetween. Similarly, the ground areas 137 interconnected with the ground area constituted by the layer $L_4$ effectively shield the signal lines 135a, 135b, 135c and 135d from each other so that respective high frequency signals can be transmitted through the signal lines 135a–135d without significant cross-talk therebetween.

However, since the ground areas or planes constituted by the layers $L_2$ and $L_4$ are positioned outwardly in respect to the layers $L_1$ and $L_3$ containing the signal lines 134a–134d and ground areas 136 and the signal lines 135a–135d and ground areas 137, respectively, it is desirable that the signal lines 134a–134d at one side of the third dielectric lamina 133 be offset relative to the signal lines 135a–135d at the opposite side of the lamina 133 for reducing cross-talk between high frequency signals transmitted through the signal lines 134a–134d on the one hand, and high frequency signals transmitted through the signal lines 135a–135d, on the other. More specifically, in the embodiment of FIG. 11, the signal lines 134a, 134b, 134c and 134d are shown to be transversely offset in respect to the signal lines 135a, 135, 135c and 135d, respectively, so that each of the signal lines 134a–134d will be disposed opposite one of the ground areas 137, while each of the signal lines 135a–135d will be disposed opposite a respective one of the ground areas 136.

Although the holes 128 in the printed circuit board 120 of FIG. 6 were bored continuously from the layer $L_1$ at the front surface of the board to the layer $L_3$ at the back surface so that the conductive solder or plating in the holes 128 will conductively connect the ground areas 126 and 127 with the ground areas constituted by the layers $L_2$ and $L_4$, such mutual connection is not necessary. Thus, as shown on FIG. 11, the holes 138 may only extend through the lamina 131 so that the conductive solder or plating in such holes will electrically connect the ground areas 136 only with the ground area constituted by the layer $L_2$. Similarly, the holes 139 may extend only through the lamina 132 so that the conductive solder or plating in such holes will only electrically connect the ground areas 137 with the ground area constituted by the layer $L_4$. The arrangement of the holes 138 and 139 in FIG. 11 is particularly suited to the previously described transverse offsetting of the signal lines 134a–134d relative to the signal lines 135a–135d.

Figure 7:
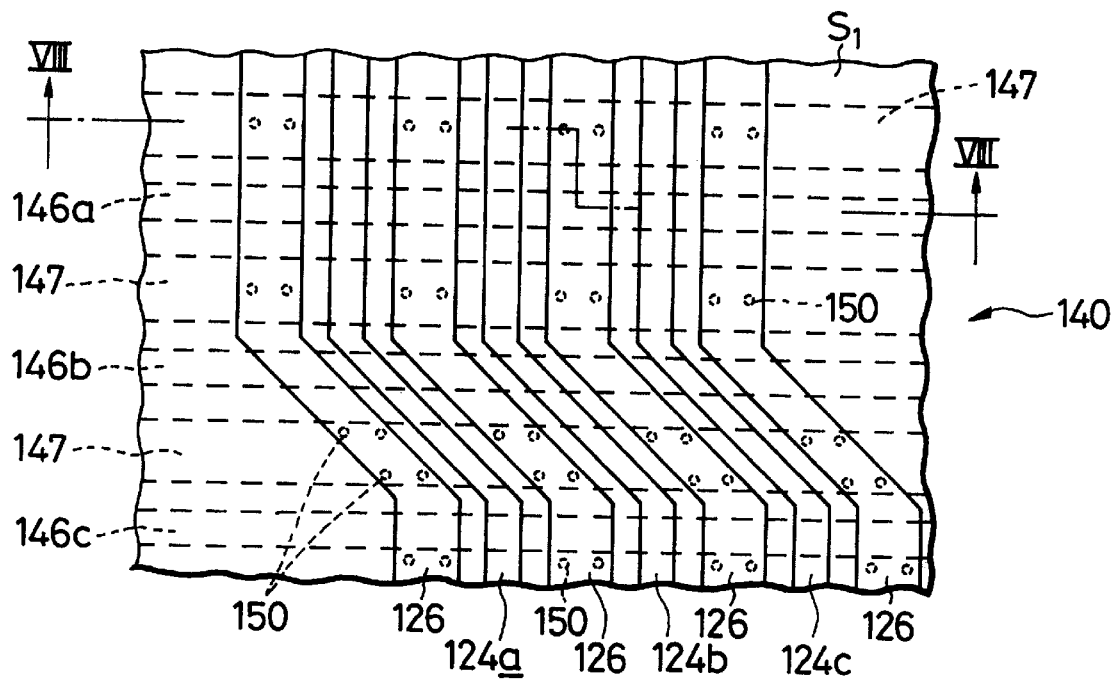
FIG. 7 is a fragmentary plan view similar to that of FIG. 4, but showing a printed circuit board according to still another embodiment of the invention which has a plurality of signal lines provided in each of four layers of the printed circuit board.
Figure 8:
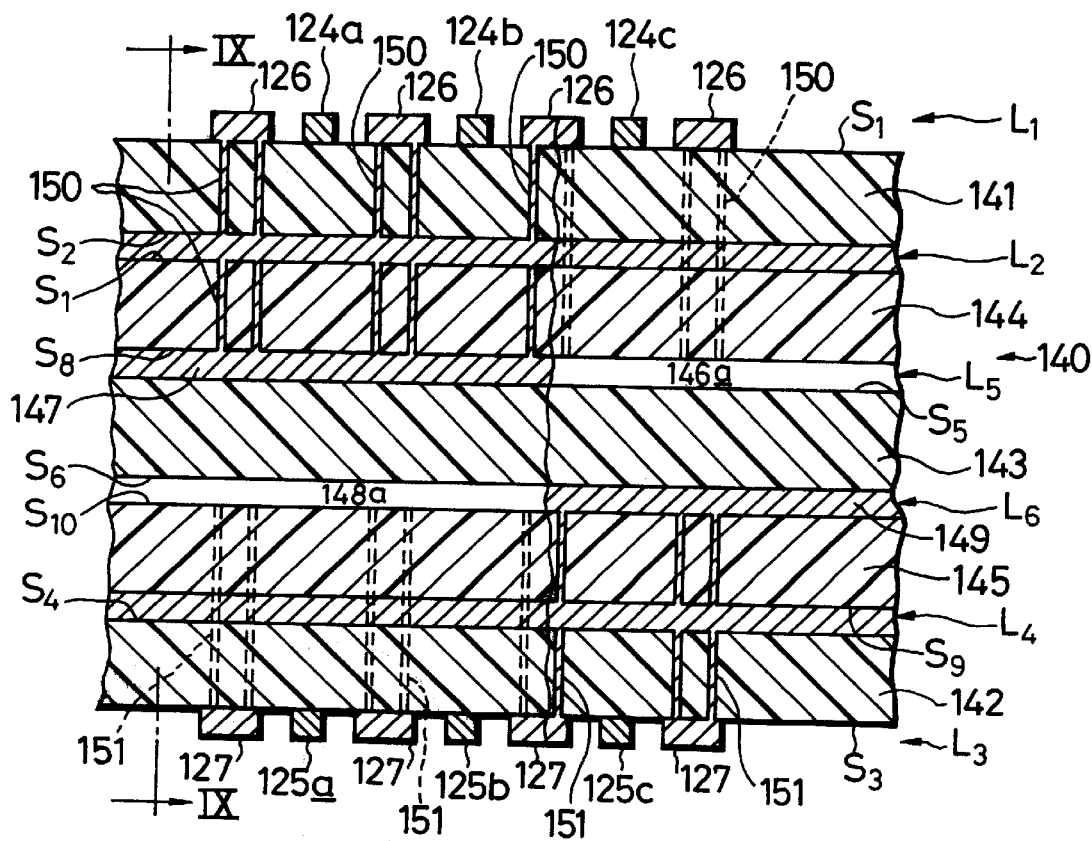
FIG. 8 is a sectional view taken along the line VIII—VIII on FIG. 7.
Figure 9:
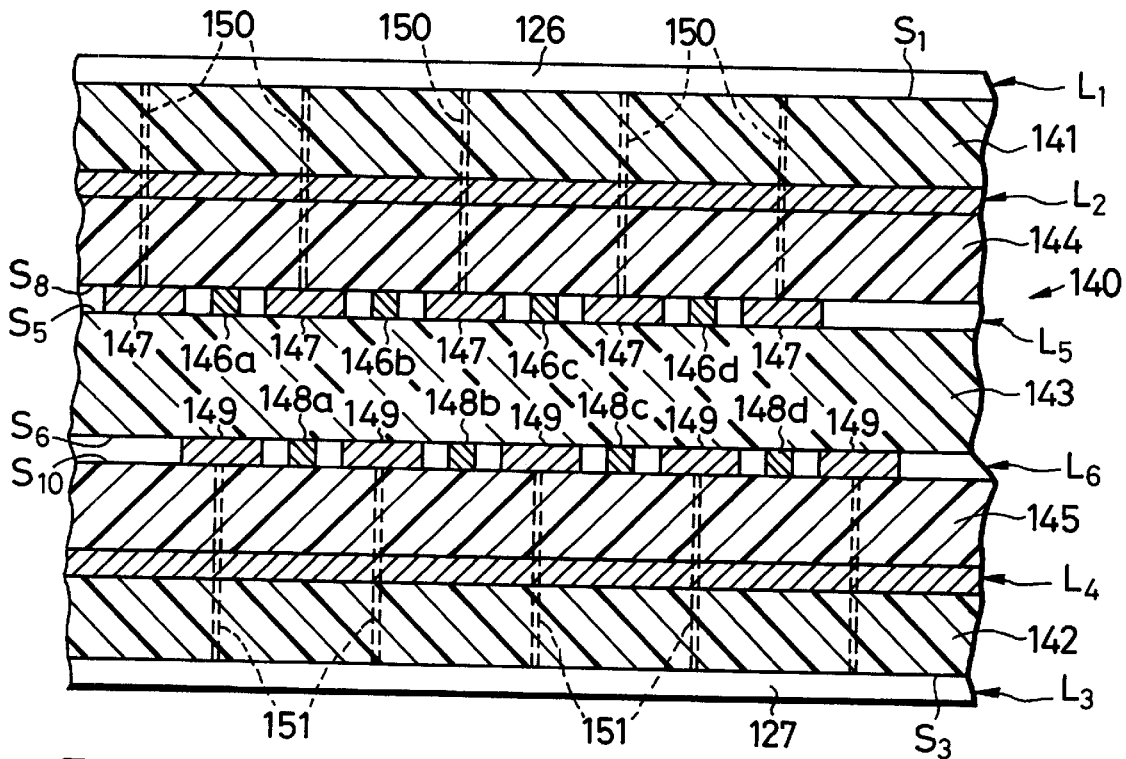
FIG. 9 is a sectional view taken along the line IX—IX on FIG. 8.

Referring now to FIGS. 7, 8 and 9, it will be seen that, in accordance with another embodiment of the invention, a so-called six-layer printed circuit board 140 may be provided with micro-strips constituting plural signal lines at four different layers or planes of the board 140 and being shielded from each other. More specifically, the printed circuit board 140 is shown to comprise a first dielectric lamina 141 having first and second layers $L_1$ and $L_2$ in its opposed surfaces $S_1$ and $S_2$, a second dielectric lamina 142 having third and fourth layers $L_3$ and $L_4$ on its opposed surfaces $S_3$ and $S_4$, and a third dielectric lamina 143 positioned between the laminae 141 and 142 with the first and third layers $L_1$ and $L_3$ on the first and second laminae, respectively, facing away from the third lamina 143 to form respective outer surfaces of the board 140. The board 140 is further shown to comprise fourth and fifth dielectric laminae 144 and 145 which are interposed between the first and third laminae 141 and 143 and between the second and third laminae 142 and 143, respectively.

One of the surfaces $S_7$ of the fourth lamina 144 confronts the second layer $L_2$ on the first lamina 141, and a fifth layer $L_5$ is deposited on the outer surface $S_8$ of the fourth lamina 144 and confronts the surface $S_5$ of the third lamina 143. Similarly, a surface $S_9$ of the fifth dielectric lamina 145 confronts the fourth layer $L_4$ on the second lamina 142, and a sixth layer $L_6$ is deposited on the other surface $S_{10}$ of the fifth lamina 145 which confronts the surface $S_6$ of the third dielectric lamina 143.

In the printed circuit board 140, the layers $L_1$ and $L_2$ on the first lamina 141 and the layers $L_3$ and $L_4$ on the second lamina 142 are similar to the layers $L_1$, $L_2$, $L_3$ and $L_4$ described above for the board 120 in FIG. 6. Thus, the first layer $L_1$ deposited on the surface $S_1$ is comprised of a plurality of spaced apart micro-strips constituting respective signal lines 124a, 124b and 124c, and a pattern of first ground areas 126 arranged between the signal lines 124a, 124b and 124c on the surface $S_1$, while the second layer $L_2$ on the surface $S_2$ of the lamina 141 constitutes a second ground area. Similarly, the third layer $L_3$ on the surface $S_3$ of the second lamina 142 is comprised of a plurality of spaced apart micro-strips constituting respective signal lines 125a, 125b and 125c which, in the embodiment shown on FIGS. 7, 8 and 9, are aligned with the signal lines 124a, 124b and 124c, respectively, on the opposite outer surface $S_1$ of the board 140. The third layer $L_3$ on the second lamina 142 is further shown to include a pattern of third ground areas 127 arranged between the signal lines 125a, 125b and 125c on the surface $S_3$ of the lamina 142. The fourth layer $L_4$ provided on the surface $S_4$ of the second dielectric lamina 142 constitutes a fourth ground area.

The fifth layer $L_5$ deposited on the surface $S_8$ of the fourth dielectric lamina 144 and confronting the surface $S_5$ of the third or middle dielectric lamina 143 is particularly shown in FIG. 9 to include a plurality of spaced apart micro-strips constituting respective signal lines 146a, 146b, 146c and 146d, and a pattern of fifth ground areas 147 arranged between the signal lines 146a, 146b, 146c and 146d. Similarly, the sixth layer $L_6$ deposited on the surface $S_{10}$ of the fifth dielectric lamina 145 which confronts the surface $S_6$ of the third dielectric lamina 143 is shown to include a plurality of spaced apart micro-strips constituting respective signal lines 148a, 148b, 148c and 148d, and a pattern of sixth ground areas 149 arranged between the signal lines 148a, 148b, 148c and 148d on the surface $S_{10}$ of the lamina 145.

In the printed circuit board 140, holes 150 extend through the fourth dielectric lamina 144 and through the first dielectric lamina 141 and each have openings at the second ground area defined by the layer $L_2$ between the laminae 141 and 144, and also at the first and fifth ground areas 126 and 147 in the first and fifth layers $L_1$ and $L_5$. Similarly, holes 151 extend through the laminae 142 and 145 and have openings at the fourth ground area constituted by the layer $L_4$ between the laminae 142 and 145, and each having openings at a respective one of the third ground areas 127 and a respective one of the sixth ground areas 149. Conductive means, such as, solder or a conductive plating, in the holes 150 and 151 extend through the laminae 141 and 144 and through the laminae 142 and 145 for electrically connecting the first and fifth ground areas 126 and 147 with the ground area constituted by the layer $L_2$, and for similarly electrically connecting the third and sixth ground areas 127 and 149 with the ground area constituted by the layer $L_4$.

Since the ground area 126 extending between the signal lines 124a–124c and the ground areas 147 extending between the signal lines 146a–146d are electrically connected with the ground area or plane constituted by the layer $L_2$ extending between the layers $L_1$ and $L_5$ containing the signal lines 124a–124c and the signal lines 146a–146d, respectively, it is apparent that each of the signal lines in the layers $L_1$ and $L_5$ is shielded from the other signal lines in those layers. Each of the signal lines in the layers $L_3$ and $L_6$ is similarly shielded from all of the other signal lines in those two layers. However, since the signal lines 146a–146d in the layer $L_5$ are only separated from the signal lines 148a–148d in the layer $L_6$ by the dielectric lamina 143, cross-talk between signals transmitted through the signal lines in the layer $L_5$ and signals transmitted through the signal lines in the layer $L_6$ is alleviated by transversely offsetting the signal lines 146a, 146b, 146c and 146d relative to the signal lines 148a, 148b, 148c and 148d, respectively, so that each of the signal lines in the layer $L_5$ is disposed opposite a ground area 149 in the layer $L_6$ and, conversely, each of the signal lines in the layer $L_6$ is disposed opposite a ground area 147 in the layer $L_5$ as shown on FIG. 9. Further, as is apparent from FIGS. 7, 8 and 9, the signal lines 146a–146d and intervening ground areas 147 in the layer $L_5$, and the signal lines 148a–148d and intervening ground areas 149 in layer $L_6$ may be angularly offset, for example, extend at right angles, as shown, relative to the signal lines 124a–124c and intervening ground areas 126 in layer $L_1$ and the signal lines 125a–125c and intervening ground areas 127 in layer $L_3$ so that the signal lines in layers $L_5$ and $L_6$ may exit from the block 140 at locations substantially spaced from the locations where the signal lines in layers $L_1$ and $L_3$ exit from the block.

As is apparent on FIG. 8, the holes 150 and 151 extend from the outer surfaces $S_1$ and $S_3$ of the block 140 to the layers $L_5$ and $L_6$, that is, the holes 150 and 151 do not pass through the third or middle lamina 143.

Figure 10:
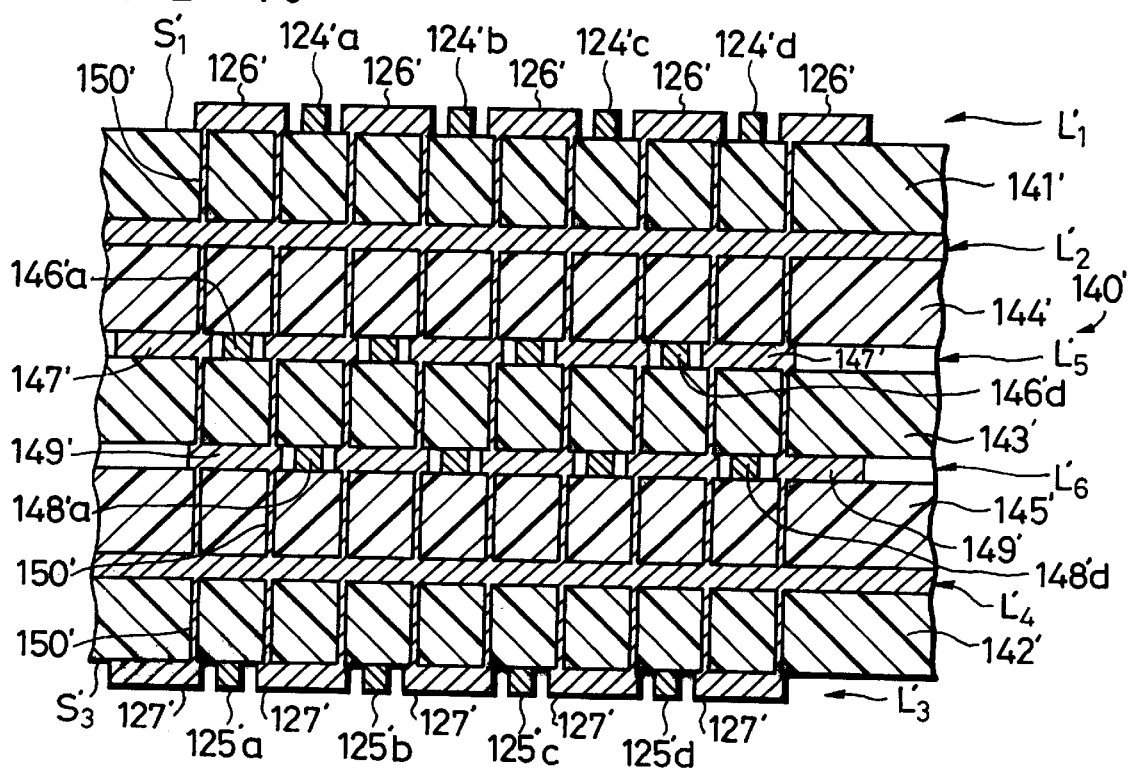
FIG. 10 is a sectional view similar to that of FIG. 8, but showing a printed circuit board according to still another embodiment of the invention which has plural signal lines provided in each of four layers of the board.

However, reference to FIG. 10 will show that, in a printed circuit board 140' that is generally similarly to the previously described board 140 and has its several elements identified by the same reference numerals but with primes attached thereto, continuous holes 150' may extend through all of the laminae 141'–145', that is, from one other surface $S'_1$ to the opposite outer surface $S'_3$ of the board. Further, in the board 140' according to this invention, the signal lines 124'a–124'd and ground areas 126' in the layer $L'_1$, the signal lines 125'a–125'd and the ground areas 127' in the layer $L'_3$, the signal lines 146'a–146'd and the ground areas 147' in the layer $L_5$, and the signal lines 148'a–148'd and the ground areas 149' in the layer $L'_6$, all extend substantially parallel to each other with the signal lines in each of the layers $L'_1$, $L'_5$, $L'_6$ and $L'_3$ being transversely offset in respect to the signal lines in the next closest ones of such layers. Thus, for example, the signal lines 146'a–146'd in the layer $L'_5$ are transversely offset relative to the signal lines 148'a–148'd of the layer $L'_6$ for alleviating cross-talk between the signal lines in the layers $L'_5$ and $L'_6$ which are only separated by the dielectric lamina 143'. The alternating transverse staggering of the signal lines from one layer to the next among the layers $L'_1$, $L'_5$, $L'_6$ and $L'_3$ facilitates the formation of the continuous holes 150' and the three-dimensional shielding of each of the signal lines in the layers $L'_1$, $L'_5$, $L'_6$ and $L'_3$.

Printed circuit boards having signal lines formed thereon in accordance with the present invention, as described above with reference to any of FIGS. 4–11, are particularly suited for incorporation in video switchers and the like where the alleviation of cross-talk between high frequency signals transmitted in adjacent signal lines and the provision of such signal lines by spaced apart micro-strips on the printed circuit boards with the resultant possibility of miniaturizing the device and reducing its cost are important characteristics. Reference is made to U.S. Pat. Nos. 4,199,788, 4,488,169, 4,954,898, 4,965,844 and 5,276,445, as showing video switchers and like devices in which the described printed circuit boards may be desirably utilized.

Figure 12:
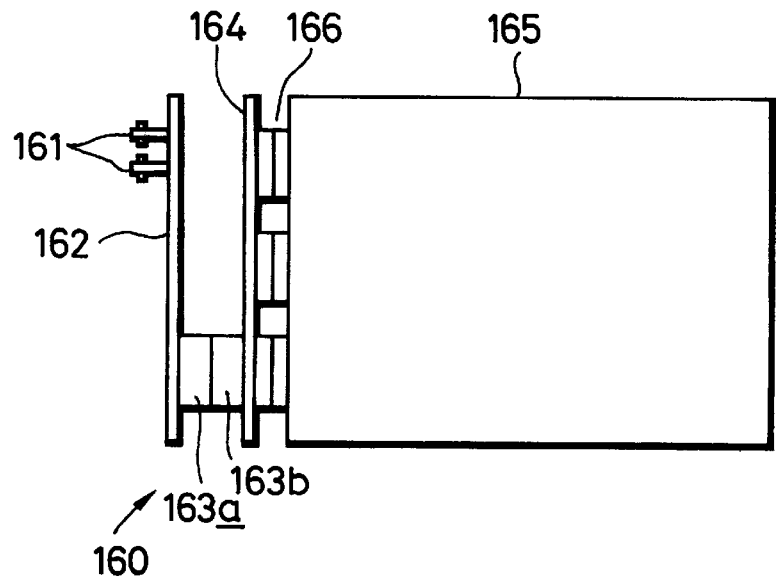
FIG. 12 is a side elevational view illustrating a video switcher comprised of several printed circuit boards at least one of which has signal lines incorporated therein in accordance with any one of the embodiments of the invention illustrated in FIGS. 4–11.
Figure 13:
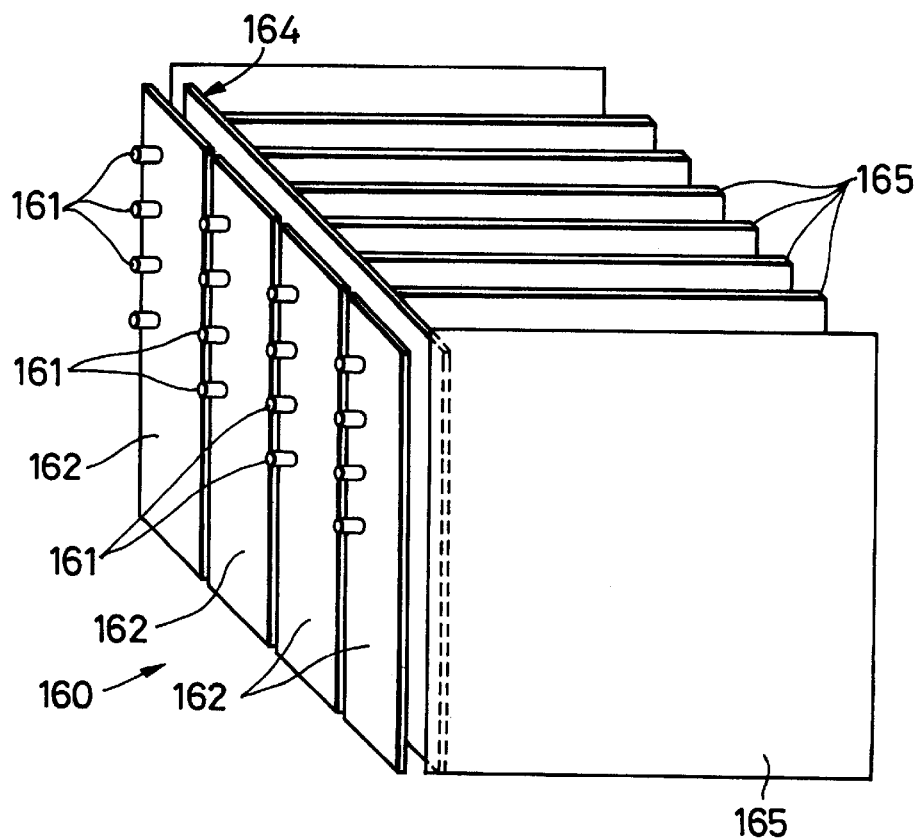
FIG. 13 is a schematic perspective view showing the components of the video switcher of FIG. 12.

FIGS. 12 and 13 schematically illustrate a video switcher or other like device 160 in which coaxial cables (not shown) from the outside of the device are coupled to BNC connectors 161 provided on one surface of a number of side-by-side arranged connector boards 162 so that signals supplied through the coaxial cables are passed through signal lines on the connector boards 162 to portions 163a of DIN connectors provided on the surfaces of the connector boards 162 remote from the BNC connectors 161. Each connector board 162 is coupled to a mother board 164 by a mating portion 163b of the DIN connector formed on the mother board so that each connector board 162 is arranged parallel to the mother board 164 with the several connector boards 162 in side-by-side relation, as shown particularly on FIG. 13. A plurality of circuit boards 165 are coupled to the mother board 164 through respective DIN connectors 166 so that the circuits boards 165, which may be considered daughter boards, extend parallel to each other and at right angles to the plane of the mother board 164 from the side of the latter facing away from the connector boards 162. Signals can be readily transmitted at high speed through the boards 162, 164 and 165 interconnected as described above, particularly when one or more of the connector boards 162, mother board 164 and circuit boards 165 has signal lines provided thereon in a manner described above with reference to any of FIGS. 4–11.

Although preferred embodiments of the invention have been described in detail above with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. In a printed circuit board, the combination of:
   at least a first dielectric lamina having opposed surfaces;
   a first layer deposited on one of said surfaces and comprised of a plurality of first layer signal lines on said one of said surfaces connected to a signal source, and a plurality of first ground areas of a defined width connected to ground arranged between said first layer signal lines on said one of said surfaces of the first lamina such that each of said first layer signal lines has one of said first ground areas on a side thereof so that each of said first layer signal lines is not immediately adjacent to another of said first layer signal lines;

a second substantially uninterrupted layer on the other of said surfaces of the first lamina and constituting a second ground area connected to ground which is substantially coextensive with said other of said surfaces;

at least two holes extending through said first lamina between one of said first ground areas and said second ground area and each of said holes having openings at one of said first ground areas and at said second ground area; and conductive means in said holes electrically connecting said first and second ground areas for shielding said first layer signal lines on said one of said surfaces from each other and wherein the separation between said holes extending between one of said first ground areas and said second ground area is less than the width of said one of said first ground areas.

2. A printed circuit board according to claim 1; in which said conductive means includes a conductive plating on an interior surface of each of said holes and contacting said first ground areas and said second ground area through said holes at said first and second ground areas.

3. A printed board according to claim 1; in which said conductive means includes solder filling each of said holes and contacting said first ground areas and said second ground area through said holes at said first and second ground areas.

4. A printed circuit board according to claim 1; further comprising at least second and third laminae each having respective opposed surfaces;

a third layer deposited on one of said surfaces of said second lamina and comprised of a plurality of spaced apart third layer signal lines connected to a signal source on said one of said surfaces of the second lamina, and a pattern of third ground areas connected to ground arranged between said third layer signal lines on said one of said surfaces of the second lamina;

a fourth substantially uninterrupted layer on the other of said surfaces of the second lamina constituting a fourth ground area connected to ground which is substantially coextensive with said other of said surfaces of said second lamina;

holes extending through said second lamina and each of said holes having openings at one of said third ground areas and at said fourth ground area;

conductive means in said holes extending through the second lamina and electrically connecting said third and fourth ground areas for shielding said third layer signal lines on said one of said surfaces of the second lamina from each other; and said third lamina being interposed between said first and second laminae with one of said first and second layers on said first lamina and one of said third and fourth layers on the second lamina facing toward opposed surfaces of said third lamina.

5. A printed circuit board according to claim 4; in which said first and third signal layers on the first and second laminae, respectively, face toward said respective opposed surfaces of said third lamina.

6. A printed circuit board according to claim 5; in which said first layer signal lines are offset in a transverse direction with respect to said third layer signal lines.

7. A printed circuit board according to claim 4; in which said second and fourth layers on the first and second laminae, respectively, face toward said respective opposed surfaces of said third lamina.

8. A printed circuit board according to claim 7; in which said first ground areas and said third ground areas have registering portions and said holes extending through said first and second laminae are aligned with each other and contiguous with said holes in said third lamina.

9. A printed circuit board according to claim 4, in which said first and third layers on the first and second laminae, respectively, face away from said third lamina to form respective outer surfaces of the board; and further comprising:

fourth and fifth dielectric laminae each having respective opposed surfaces and being interposed between said third lamina and said first and second laminae, respectively;

one of said opposed surfaces of said fourth lamina confronting said second layer on the first lamina;

a fifth layer deposited on the other of said surfaces of the fourth lamina which confronts one of said surfaces of the third lamina, said fifth layer including a plurality of fifth layer signal lines connected to a signal source on said other of said surfaces of said fourth lamina, and a pattern of fifth ground areas connected to ground arranged between said fifth layer signal lines on said other of said surfaces of the fourth lamina;

one of said opposed surfaces of said fifth lamina confronting said fourth layer on the second lamina;

a sixth layer deposited on the other of said surfaces of the fifth lamina which confronts the other of said surfaces of the third lamina, said sixth layer including a plurality of sixth layer signal lines connected to a signal source on said other of said surfaces of said fifth lamina, and a pattern of sixth ground areas connected to ground arranged between said sixth layer signal lines on said other of said surfaces of the fifth lamina;

holes extending through said fourth lamina and each of said holes having openings at one of said fifth ground areas and at said second ground area on the first lamina;

holes extending through said fifth lamina and each of said holes having openings at one of said sixth ground areas and at said fourth ground area on the second lamina; and conductive means in said holes extending through said fourth and fifth laminae and electrically connecting said second and fifth ground areas and said fourth and sixth ground areas for shielding said fifth layer signal lines from each other and shielding said sixth layer signal lines from each other.

10. A printed circuit board according to claim 9; in which said holes extending through said fourth lamina and said holes extending through said fifth lamina are aligned extensions of said holes extending through said first lamina and said holes extending through said second lamina, respectively.

11. A printed circuit board according to claim 9; in which said fifth layer signal lines on said sixth layer signal lines are offset relative to each other and also offset relative to said first layer signal lines and said third layer signal lines, respectively.

12. A printed circuit board according to claim 11; in which said fifth layer signal lines are offset transversely relative to said sixth layer signal lines, and said first and third layer signal lines, respectively, are offset angularly relatively to said fifth and sixth layer signal lines, respectively.

13. A video switcher comprising a plurality of electrically connected printed circuit boards:

at least one of said printed circuit boards comprising at least a first dielectric lamina having opposed surfaces;

a first layer deposited on one of said surfaces and comprised of a plurality of first layer signal lines on said one of said surfaces connected to a signal source, and a plurality of first ground areas of a defined width connected to ground arranged between said first layer signal lines on said one of said surfaces of the first lamina such that each of said first layer signal lines has one of said first ground areas on a side thereof so that each of said first layer signal lines is not immediately adjacent to another of said first layer signal lines;

a second substantially uninterrupted layer on the other of said surfaces of the first lamina and constituting a second ground area connected to ground which is substantially coextensive with said other of said surfaces;

at least two holes extending through said first lamina between one of said first ground areas and said second ground area and each of said holes having openings at one of said first ground areas and at said second ground area; and conductive means in said holes electrically connecting said first and second ground areas for shielding said first layer signal lines on said one of said surfaces from each other and wherein the separation between said holes extending between one of said first ground areas and said second ground area is less than the width of said one of said first ground areas.

14. A video switcher according to claim 13; in which said printed circuit boards are selected from connector, mother and daughter boards.

15. A video switcher according to claim 13; in which said conductive means includes a conductive plating on an interior surface of each of said holes and contracting said first ground areas and said second ground area through holes at said first and second ground areas.

16. A video switcher according to claim 13; in which said conductive means includes solder filling each of said holes and contacting said first ground areas and said second ground area through said holes at said first and second ground areas.

17. A video switcher according to claim 13, in which said one of said printed circuit boards further comprises at least second and third dielectric laminae each having opposed surfaces;

a third layer deposited on one of said surfaces of said second lamina and comprised of a plurality of third layer signal lines connected to a signal source on said one of said surfaces of the second lamina, and a pattern of third ground areas connected to ground arranged between said third layer signal lines on said one of said surfaces of the second lamina;

a fourth substantially uninterrupted layer on the other of said surfaces of the second lamina and constituting a fourth ground area connected to ground which is substantially coextensive with said other of said surfaces of said second lamina;

holes extending through said second lamina and each of said holes having openings at one of said third ground areas and at said fourth ground area;

conductive means in said holes extending through the second lamina and electrically connecting said third and fourth ground areas for shielding said third layer signal lines on said one of said surfaces of the second lamina from each other; and said third lamina being interposed between said first and second laminae with one of said first and second layers on said first lamina and one of said third and fourth layers on the second lamina facing toward respective opposed surfaces of said third lamina.

18. A video switcher according to claim 17; in which said first and third signal layers on the first and second laminae, respectively, face toward said respective opposed surfaces of said third lamina.

19. A video switcher according to claim 18; in which said first layer signal lines are offset in a transverse direction with respect to said third layer signal lines.

20. A video switcher according to claim 17; in which said second and fourth layers on the first and second laminae, respectively, face toward said respective opposed surfaces of said third lamina.

21. A video switcher according to claim 20; in which said first ground areas and said third ground areas have registering portions and said holes extending through said first and second laminae are aligned with each other and contiguous with said holes in said third lamina.

22. A video switcher according to claim 17; in which said first and third layers on the first and second laminae, respectively, face away from said third lamina to form respective outer surfaces of the board; and in which said one of said printed circuit boards further comprises:

fourth and fifth dielectric laminae each having respective opposed surfaces and being interposed between said third lamina and said first and second laminae, respectively;

one of said opposed surfaces of said fourth lamina confronting said second layer on the first lamina;

a fifth layer deposited on the other of said surfaces of the fourth lamina which confronts one of said surfaces of the third lamina, said fifth layer including a plurality of fifth layer signal lines connected to a signal source on said other of said surfaces of said fourth lamina, and a pattern of fifth ground areas connected to ground arranged between said fifth layer signal lines on said other of said surfaces of the fourth lamina;

one of said opposed surfaces of said fifth lamina confronting said fourth layer on the second lamina;

a sixth layer deposited on the other of said surfaces of the fifth lamina which confronts the other of said surfaces of the third lamina, said sixth layer including a plurality of sixth layer signal lines connected to a signal source on said other of said surfaces of said fifth lamina, and a pattern of sixth ground areas connected to ground arranged between said sixth layer signal lines on said other of said surfaces of the fifth lamina;

holes extending through said fourth lamina and each of said holes having openings at one of said fifth ground areas and at said second ground area on the first lamina;

holes extending through said fifth lamina and each of said holes having openings at one of said sixth ground areas and at said fourth ground area on the second lamina; and conductive means in said holes extending through said fourth and fifth laminae and electrically connecting said second and fifth ground areas and said fourth and sixth ground areas for shielding said fifth layer signal lines from each other and shielding said sixth layer signal lines from each other.

23. A video switcher according to claim 22; in which said holes extending through said fourth lamina and said holes extending through said fifth lamina are aligned extensions of said holes extending through said first lamina and said holes extending through said second lamina, respectively.

24. A video switcher according to claim 22, in which said fifth layer signal lines and said sixth layer signal lines are offset relative to each other and also offset relative to said first layer signal lines and said third layer signal lines, respectively.

25. A video switcher according to claim 24, in which said fifth layer signal lines are offset transversely relative to said sixth layer signal lines, and said fifth and sixth layer signal lines, respectively, are offset angularly relative to said first and third layers signal lines, respectively.

* * * * *